United States Patent
Shiraishi

[11] Patent Number: 5,867,691
[45] Date of Patent: Feb. 2, 1999

[54] SYNCHRONIZING SYSTEM BETWEEN FUNCTION BLOCKS ARRANGED IN HIERARCHICAL STRUCTURES AND LARGE SCALE INTEGRATED CIRCUIT USING THE SAME

[75] Inventor: Hajime Shiraishi, Tokyo-To, Japan

[73] Assignee: Kabushiki Kaisha Toshiba, Kawasaki, Japan

[21] Appl. No.: 31,363

[22] Filed: Mar. 15, 1993

[30] Foreign Application Priority Data

Mar. 13, 1992 [JP] Japan .................................... 4-055654

[51] Int. Cl.$^6$ ...................................................... G06F 1/12
[52] U.S. Cl. ........................................... 395/551; 364/488
[58] Field of Search ..................... 395/550, 325, 395/551, 555; 364/488, 489

[56] References Cited

U.S. PATENT DOCUMENTS

| | | | |
|---|---|---|---|
| 4,068,214 | 1/1978 | Patil ..................................... | 340/166 R |
| 4,901,225 | 2/1990 | Shiraishi ................................ | 364/200 |
| 5,021,947 | 6/1991 | Campbell et al. .................. | 364/DIG. 1 |
| 5,111,388 | 5/1992 | Shiraishi ................................ | 395/800 |

OTHER PUBLICATIONS

Meng et al, Automatic Synthesis of Asynchronous Circuits from High–Level Specifications, IEEE Trans. on Computer Aided Design on Integ Circuits Nov. 1989.

Berthet et al, Synthesis of Speed–Independent Circuits from Algebraic Specifications, Circuits & Systems, 1988 IEEE Intl. Symposium, pp. 1869–1872.

Dill et al, Automatic Verification of Speed–Independent Circuits with Petri Net Specifications, ICCD '89, Intl. Conf. pp. 212–216.

Lam, et al., "Hierarchical Design of Delay–Insensitive systems", IEE Proceedings E, vol. 137, No. 1, Jan. 1990, pp. 41–56.

Jacobs, et al., "A Fully Asynchronous Digital Signal Processor Using Self–Timed Circuits", IEEE Journal of Solid-State Circuits, vol. 25, No. 6, Dec. 1990, pp. 1526–1536.

Amon, et al., "Sizing Synchronization Queues: A Case Study in Higher Level Synthesis", 28th ACM/IEEE Design Automation Conference, Paper 39.5, Jun. 1991, pp. 690–693.

*Primary Examiner*—Lucien U. Toplu
*Attorney, Agent, or Firm*—Foley & Lardner

[57] ABSTRACT

An inter-hierarchy synchronizing system and an LSI include a plurality of function blocks taking a hierarchical structure and having timing systems expressed by timing variables independent of each other and inter-hierarchy synchronizing blocks disposed these hierarchies. This synchronizing block has: an input event temporary storage part for receiving and storing an input event generation signal group from a higher-level block; an activation timing judging part for judging activations of a plurality of function blocks and transmitting activation signals; an output event temporary storage part for receiving and storing output event generation signals including a completion signal from lower-level blocks; and a final completion signal judging part for judging a final completion state on the basis of a signal from the output event temporary storage part and transmitting a final completion signal to the high-block. The pre-designed function blocks are operable at a high speed without undergoing an influence by a delay of clocks.

6 Claims, 12 Drawing Sheets

SYNCHRONIZING SYSTEM BETWEEN FUNCTION BLOCKS ARRANGED IN HIERARCHICAL STRUCTURES AND LARGE SCALE INTEGRATED CIRCUIT USING THE SAME

BACKGROUND OF THE INVENTION

1. Field of the Invention

The present invention relates generally to an inter-hierarchy synchronizing system and an LSI using this system and, more particularly, to an LSI in which the existing system is actualized based on a hierarchical structure in a semiconductor chip.

2. Description of the Prior Art

An LSI having as many as several millions or more of elements is complicated in its configuration and is therefore impossible to design manually. Designing inevitably involves a computer aided design (CAD). In this case, an integrated circuit is constructed by combining predesigned blocked circuits. The typical blocks to be combined are designed by use of gate arrays and standard cells.

Figure 1:
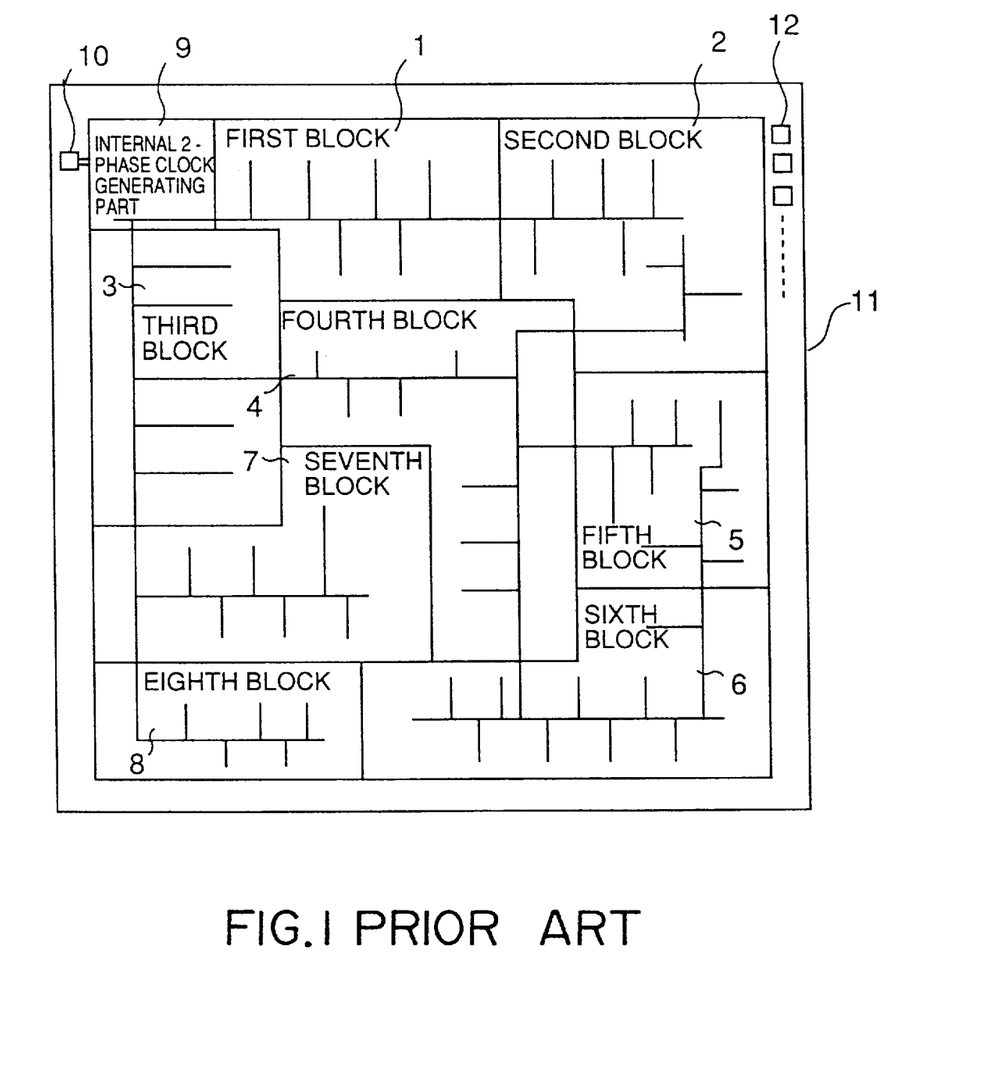
FIG. 1 is a diagram illustrating an internal configuration of a conventional LSI.

FIG. 1 is an internal block diagram showing one example of a conventional LSI employed as a system constituting a large proportion or a part of an applied appliance. As illustrated in FIG. 1, this LSI is constructed in such a way that first through eighth circuit blocks 1–8 are formed in an LSI chip 11. These blocks 1–8 are operated in response to clock signals from an internal 2-phase clock generating part 9 or an external clock input terminal 10. Further, these blocks 1–8 are formed to input and output signals to the exterior of the LSI chip 11 via a bonding pad area 12.

A design of such an LSI involves fractionalizing the system into the first to eight blocks according to their functions and designing logical circuits for the respective blocks by use of gate arrays, etc.. Then, all these blocks 1–8 are connected. Contents of a logical drawing are inputted to a CAD tool. Whether the design is correct or not is verified by performing logical simulation of the whole. A layout, wiring, a prototype production and an improvement of the LSI are conducted based on a result of this verification.

Further, the following method is employed for obtaining a correct and stable operation of the LSI. To be specific, synchronizing clocks supplied from the internal 2-phase clock generating part 9 or the external clock input terminal 10 are delivered to the overall chip. For example, the respective blocks are unified by a single 2-phase clock system such as clocks $\Phi 1$, $\Phi 2$. Further, storage circuit parts are constructed of synchronous type circuits to the greatest possible degree. In addition, the essential timing judging and generating parts are operated in synchronism by means of single 2-phase clocks. As a result, control signals are transmitted as if spreading a net between the respective circuit blocks. The respective circuits are thus linked in a firm timing dependent relationship.

As described above, the conventional LSI adopts a so-called absolute synchronism design method, wherein the overall area of the chip is synchronized by using the single 2-phase clock system with respect to logical components such as microprocessors, gate arrays and standard cells in order to stably operate this LSI. Under such circumstances, if timings indicated by the single 2-phase clocks delivered to the overall chip separately arrive at a certain location in chip, this embraces possibility to cause a malfunction of the in-chip circuit system.

This possibility can be seen in the real scene. The method given above can not be applied even with the present CMOS process on the rule or 1.5 $\mu$m–1.0 $\mu$m in some cases.

Referring to the system of FIG. 1 for example, the interior of the chip is fractionalized into the first to eight blocks 1–8. During this block fractionalizing, there is almost no case where the design is conducted by elaborately analyzing a system request specification. That is, the dominant method is a chip construction method of directly allocating large-scale cells (mega cells) constituting independent high-function blocks of peripheral cores, MPU cores and further a cell library containing known physical dimensions of already-designed ALUs, multiplexers, decoders, register files, flip-flops, ROMs, RAMs, counters, shift registers and primitive gates (NAND, NOR, NOT, etc.).

Accordingly, as explained above, if this absolute synchronism design method is unreasonably applied to a high-speed VLSI, the clock delivery line group is brought into an almost stray state. It is almost impossible to give a consideration in terms of design to relieve this state. Consequently, the probability to cause the malfunction remarkably increases.

For this reason, the clock frequency is decreased in an attempt to obtain reliable operation. As a result, in the case of the LSI constructed on the rule of 1.0 $\mu$m, the situation is such that the maximum system operation speed of the entire chip has to be set, though the element switching speed is as high as 300 ps–1 ns, extremely down to $\frac{1}{50}$–$\frac{1}{100}$ of this maximum speed.

It is predicted that the VLSI in the future will adopt a hyperfine technology on the rule of 0.6 $\mu$m or under and have several millions to several ten millions of elements for logic and approximately one hundred million of elements for memory. It is also predicted that the chip size will become as large as 10 mm×10 mm or more. Besides, the operation frequency is increased up to 30 MHz–100 MHz.

Under such circumstances, a rate of wiring delay time increases as compared with an element delay time. More specifically, the element switching speed is 0.1–0.3 ns, while the wiring delay becomes several ns/mm. For instance, one clock is 10 ns in a clock frequency of 100 MHz, and therefore it may be understood how large the influence of the wiring delay is.

If the LSI chips that have already been put on the commercial line are to be shrunk in size in an attempt to reduce the costs and increase the speed at the present time, the malfunction of the chip is induced. In the majority of cases, the design is forced to be fundamentally reviewed. More naturally, the VLSI takes the intrinsic synchronizing method of clocks in every portion of the chip. Consequently, a large phase difference is forced to occur due to indirect fluctuations in tinting and delivery route.

Figure 2A:
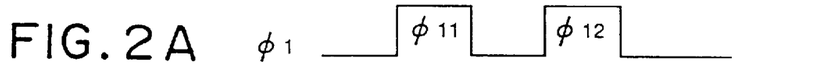
FIGS. 2A–2G are explanatory timing charts showing operations in an absolute synchronism IC.
Figure 2B:
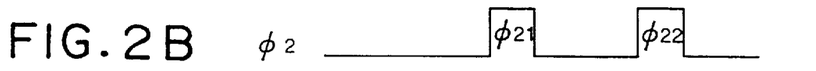
Figure 2C:
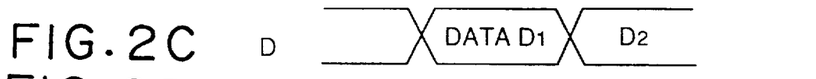
Figure 2D:
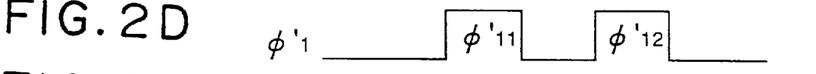
Figure 2E:
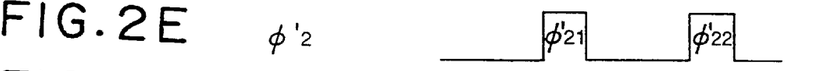

As explained above, the side effect in terms of timing increases with a larger chip size and a finer process. This aspect will be exemplified with reference to timing charts of FIGS. 2A–2G. As illustrated in FIGS. 2A and 2B, when arriving at the in-system blocks, clocks $\Phi_{11}$, $\Phi_{12}$ of a clock $\Phi 1$ and clocks $\Phi_{21}$, $\Phi_{22}$ of a clock $\Phi 2$ largely shift in phase as in the case of clocks $\Phi'_{11}$, $\Phi'_{12}$ of a clock $\Phi'1$ and clocks $\Phi'_{21}$, $\Phi'_{22}$ of a clock $\Phi'2$ as shown in FIGS. 2D and 2E.

Figure 2F:
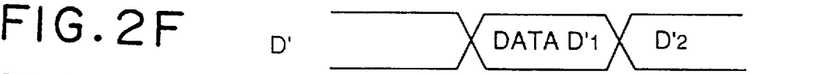
Figure 2G:
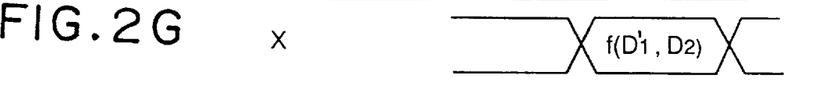
Figure 3:
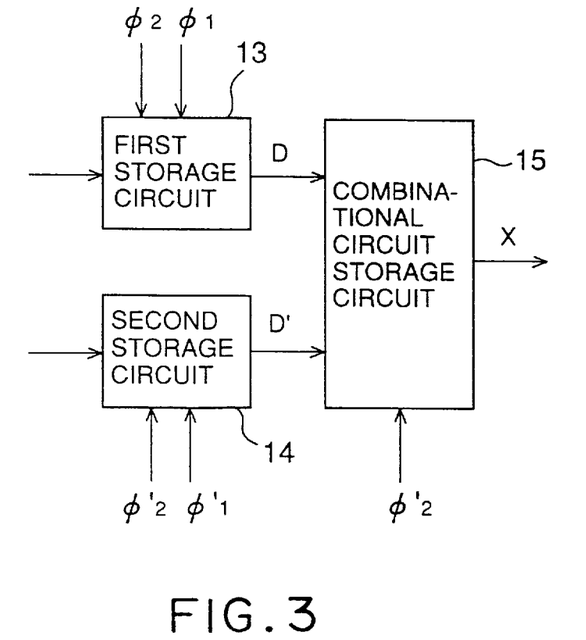
FIG. 3 is a block diagram showing an example of a circuit for explaining the operations in the absolute synchronism IC.

Consider a circuit shown in FIG. 3 by way of an example of the system operating with such clocks. Data D shown in FIG. 2C is fetched from a first storage circuit 13 shown in FIG. 3. Data D' shown in FIG. 2F is fetched from a second storage circuit 14. It is assumed that an output X illustrated in FIG. 2G is obtained from a combinational circuit/storage circuit 15 to which outputs of the storage circuits 13, 14 are inputted. In this case, it is also assumed that the clocks $\Phi 1$, $\Phi 2$ shown in FIGS. 2A and 2B are supplied to the first storage circuit 13; the clocks $\Phi'1$, $\Phi'2$ shown in FIGS. 2D and 2E are supplied to the second storage circuit 14; and the clock Φ'2 is supplied to the combinational circuit/storage circuit 15. In this instance, there arises a problem when an expected result f (D1, D'1) is not obtained as the output X from the combinational circuit/storage circuit 15, but an incorrect result f (D'1, D2) comes out.

Further, the phase difference derived from a difference in length among the delivery routes of the clock system and a turn-around thereof causes a critical path in every portion of the IC. The advantages of the synchronism type circuit design method are lost. To avoid this situation, there is needed a local time adjustment for queuing till the next safety timing. It follows that this presents a new problem wherein an extra increment in the number of elements is induced, and further the timing can not be broadly predicted. Moreover, this again causes the malfunction due to the shrinkage in size of the chip and the circuit modification that have hitherto been implemented.

Hence, the problems described above are big obstacles in the present scene where ASIC (Application Specific IC) spreads widely in such cases that the designer uses the already-completed LSI as a mega cell by shrinking this LSI and that the LSI design is effected on a larger scale by utilizing a library of mega cells which have already been offered by LSI manufacturers. This situation implies that when constructing the large-scale software, the common variable effective in the small-scale software in turn causes a side effect enough not to actualize a software construction.

As stated above, the conventional LSI does not actually, though the design based on the absolute synchronism system as an essential requirement is adopted, include the method of creating the absolute timing. It is therefore impossible to find out a broad design method capable of predicting a completely operated LSI. The actually designed LSI acquires some reliability to such an extent that an operating possibility remains.

SUMMARY OF THE INVENTION

Accordingly, it is a primary object of the present invention to provide an inter-hierarchy synchronizing system capable of obtaining a super high-speed operation even with the occurrence of clocks in every portion when designing an integrated circuit by reusing the existing function blocks as components.

It is another object of the present invention to provide a large-scale integrated circuit using this inter-hierarchy synchronizing system.

According to the present invention, in a system including a plurality of function blocks, the function blocks take a hierarchical structure. An inter-hierarchy synchronizing means serves to connect a higher-level function block for generating input event generation signals in a higher-level timing system expressed by higher-level timing variables to lower-level function blocks for performing predetermined operations in accordance with a local timing system expressed by local timing variables. This inter-hierarchy synchronizing means generates signals for activating the lower-level function blocks in the local timing system and supplies the signals to the lower-level function blocks. At the same time, the inter-hierarchy synchronizing means generates a completion signal in the higher-level timing system with queuing of output event generation signals generated from the lower-level function blocks and supplies the completion signal to the higher-level function block.

Especially, the inter-hierarchy synchronizing means is obtained by a real timing simulation after an automatic logic synthesis as well as by an abstract timing simulation by use of respective timing variables of the lower-level function blocks and the higher-level function block. It is feasible to easily acquire the system that operates surely at a high speed without taking the absolute synchronism between the respective blocks.

Further, the circuit in the semiconductor chip is constructed of a plurality of function blocks assuming a hierarchical structure and operating with independent clocks. Provided between the hierarchies are an input event temporary storage means, an activation timing judging means, a final completion signal judging means and an output event temporary storage means. The input event generation signal group from the higher-level block is inputted and temporarily stored in the input event temporary storage means. Based on the signals from the input event temporary storage means, the lower-level blocks are activated. That is, the activation signals are transmitted to the lower-level blocks after judging a start thereof. The output event temporary storage means receives and stores the output event generation signal group including the completion signal corresponding to an operating status thereof. The final completion signal judging means judges a final completion state on the basis of a signal from the output event temporary storage means. This judging means then transmits the final completion signal to the higher-level block. The plurality of blocks can be thereby operated irrespective of the absolute synchronism on the whole.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENT

An embodiment of the present invention will hereafter be discussed with reference to the drawings.

Figure 4:
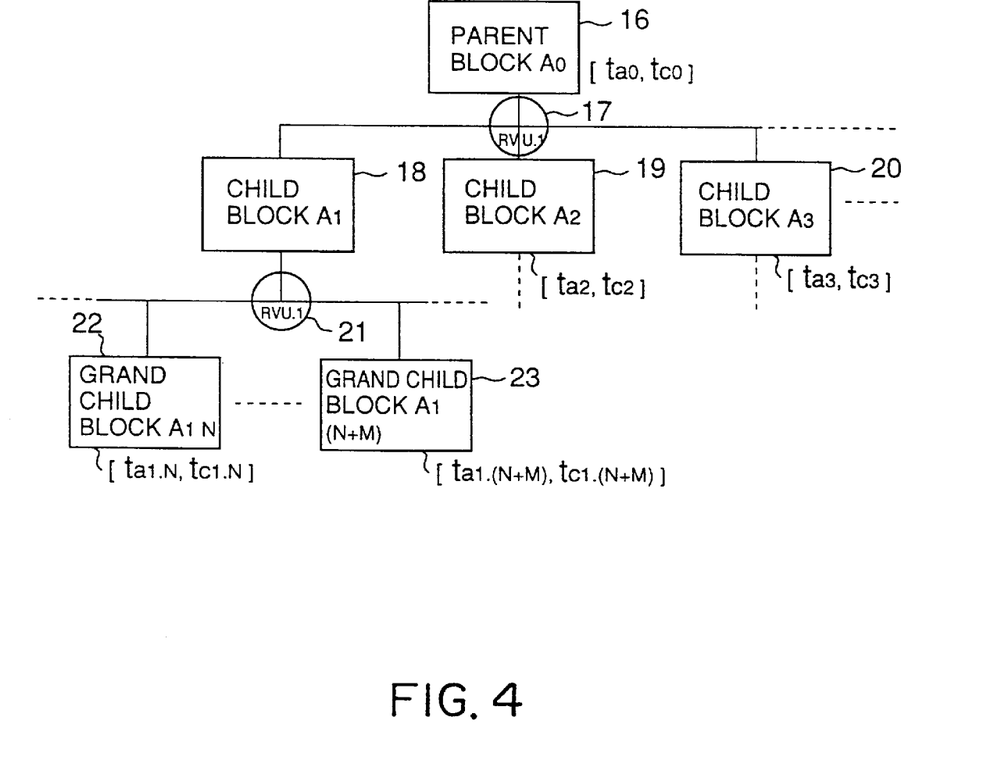
FIG. 4 is a partial block diagram illustrating a hierarchical structure of an LSI in one embodiment of this invention.

FIG. 4 is a partial block diagram illustrating a LSI in one embodiment of this invention. A system is constructed in a chip as shown in FIG. 4, wherein a parent block 16 indicated by a symbol A0 is positioned on the highest level. Next, a 0th rendezvous unit 17 ranked thereunder and indicated by the symbol RVOU is incorporated as a synchronizing circuit constituting a part of the parent block 16. Connected thereto via this 0th rendezvous unit 17 are a first lower-level child block 18 marked with A1, a second child block with A2 and a third child block 20 with A3. Then, a first rendezvous unit 21 with RVU1 is incorporated as a synchronizing circuit into the first child block 18 to constitute a part of this block 18. Thereunder, a plurality of Nth grandchild blocks 22 marked with A1, N through (N+M)th grandchild blocks 23 with A1, N+M are connected thereto.

Figure 5:
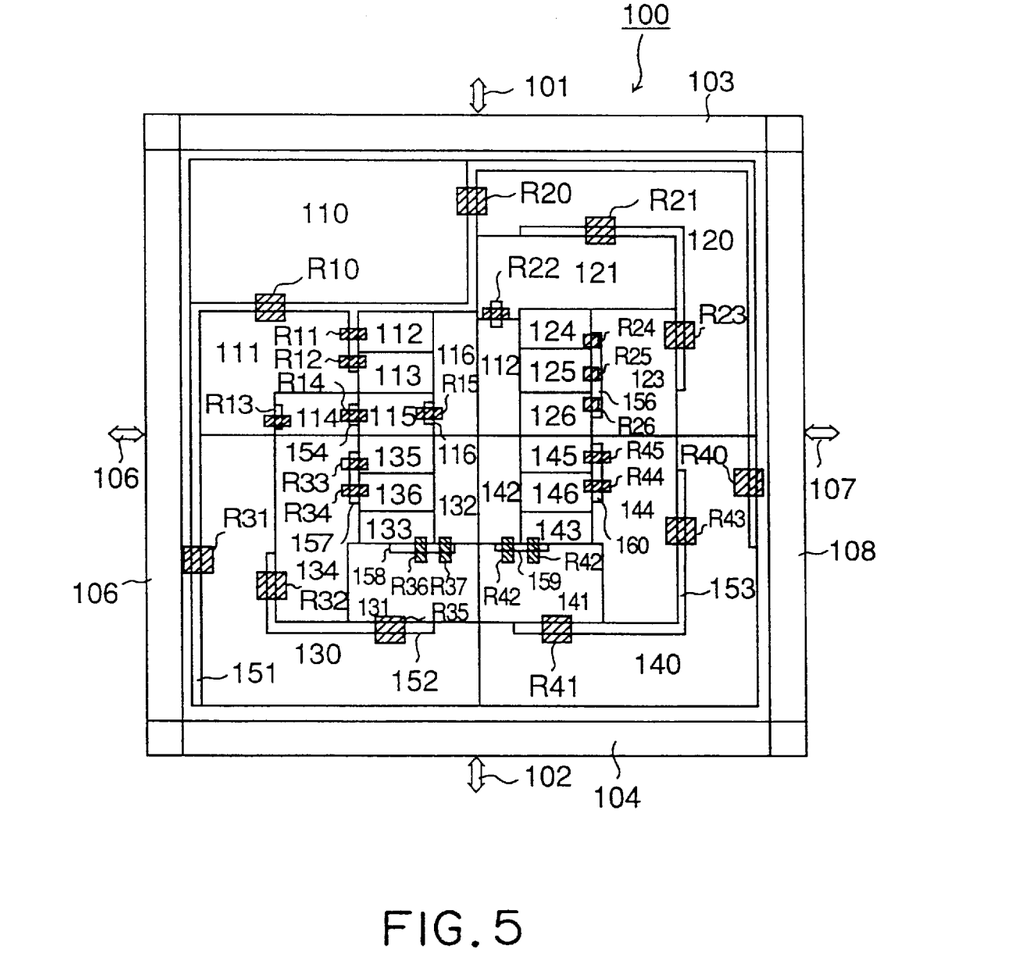
FIG. 5 is a plan view showing the LSI in which the layout shown in FIG. 4 is actualized.

FIG. 5 is a plan view illustrating a layout of FIG. 4. An LSI 100 shown in FIG. 5 includes instruction bus drivers 103, 104 connected to instruction buses 101, 102 at the upper and lower end sides. A block code bus driver 106 connected to a block code bus 105 is provided at the left end side. A status bus driver 108 connected to a status bus 107 is provided at the right end side.

This LSI includes a plurality of function blocks with a hierarchical structure. For instance, the function blocks 110, 130, 140 constitute a first hierarchy. Other blocks constitute lower hierarchies. The block 110 is connected to a function block 111 of a second hierarchy via a rendezvous unit R10. Function blocks 112, 113, 114 of a third hierarchy are connected to this function block 111 via rendezvous blocks R11, R12, R13. A function block 115 of a fourth hierarchy is connected via a rendezvous unit R14 to the function block 114. Further, a function block is connected via rendezvous unit R15 to the function block 115.

Moreover, a block 120 of the second hierarchy is connected via rendezvous unit R20 to the block 110. Hereafter, a block 121 of the third hierarchy and a block 122 of the fourth hierarchy are sequentially connected through rendezvous units R21, R22. A block 123 of the third hierarchy and blocks 124, 125, 126 of the fourth hierarchy are sequentially connected through rendezvous units R23, R24, R25, R26. Hereafter, the hierarchical structure is similarly configured by function blocks 130–136 and function blocks 140–146 in combination with rendezvous units R31–R37 and rendezvous units R41–R45. Note that the rendezvous unit is formed at a connecting part between the function blocks. For example, the rendezvous unit R10 is formed at a connecting part 151.

Next, contents of the function blocks will be explained with reference to FIG. 6.

Figure 6:
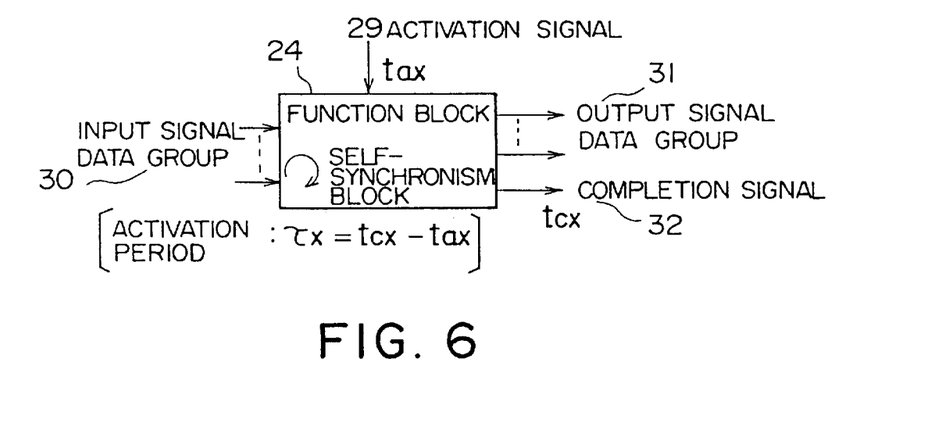
FIG. 6 is an explanatory diagram showing preparation conditions of function blocks according to the layout in FIG. 4.

As shown in FIG. 6, the function block 24 acting with a self-synchronizing clock receives an activation signal 29 from the exterior and thereby processes an input signal/data group 30. The function block 24 then outputs an output signal/data group 31. The function block 24 also outputs a completion signal 32 to the exterior.

Herein, the action of the function block will be explained. The function block 24 receives the input signal/data group 30 and is activated by the activation signal generated by the higher-level block utilizing the rendezvous unit. Then, in consequence of the action as expected, the predetermined output signal/data group 31 is transferred to the higher-level block at a timing indicated by the completion signal S2. An activation time is herein expressed such as $\tau x = tex - tax$, where tex is the completion timing of a block x, and tax is the start timing. Note that the timing employed in each function block 24 does not depend directly on the external block but is independent.

For instance, the respective function blocks shown in FIG. 4, i.e., the parent block 16, the first child block 18, the second child block 19, the third child block, the Nth grand child block 22 and the (N+M)th grandchild block 23, are started at the start timings ta0, ta1, ta2, ta3, ta1·N, tc1·(N+M). These blocks respectively continue to act up to the completion timings tc0, tc1, tc2, te3, tc1·N, tc1·(N+M).

As described above, the function blocks are elements for actualizing a VLSI. It is therefore required that conditions relative to a signal exchange with the exterior be strictly defined. For this reason, the conditions have to be exactly defined in terms of semantics and syntax by use of the system description language and the hardware description language subsequent thereto. It is also required that the circuit be constructed in the same form in whatever block and whatever hierarchy because of being useful for CAD and the chip itself.

Figure 7:
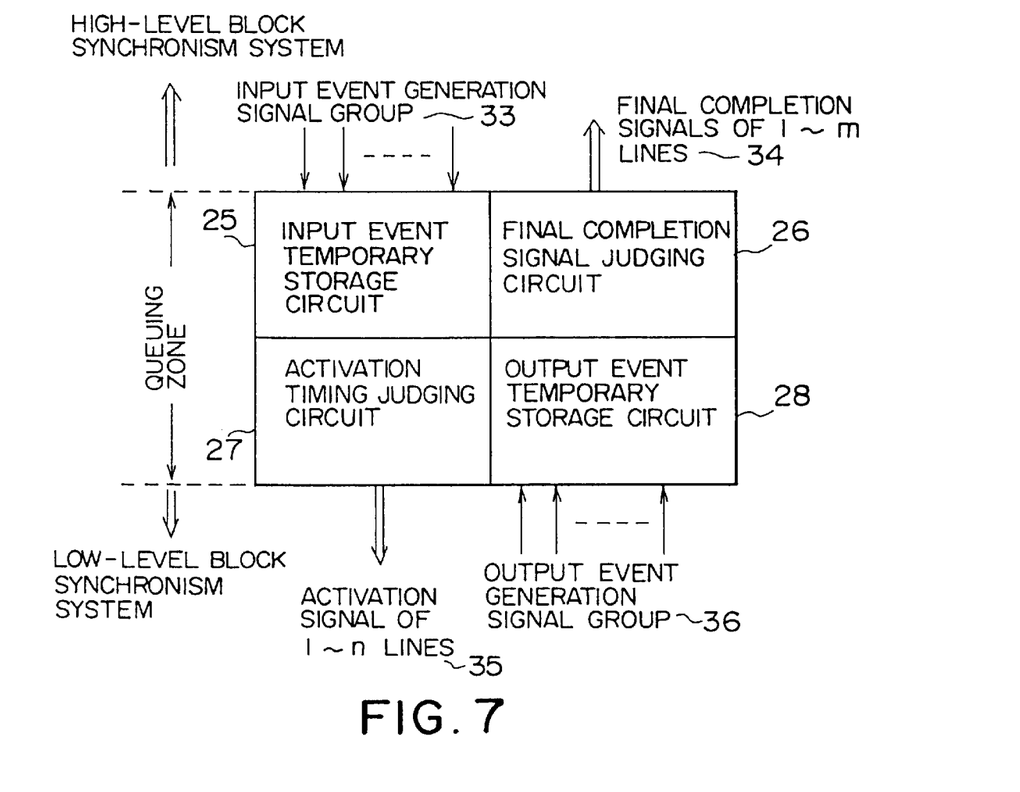
FIG. 7 is a block diagram schematically showing a rendezvous unit according to the layout in FIG. 4.

FIG. 7 is a schematic diagram illustrating a layout of a rendezvous unit such as the 0th rendezvous unit 17 and the first rendezvous unit 21 shown in FIG. 4. This rendezvous unit is a synchronizing block for making an adjustment between a synchronizing system of the higher-level block and a synchronizing block of the lower-level blocks that is utilized directly by the higher-level block. Namely, the rendezvous unit is conceived as a queuing zone dedicated to an execution of queuing of events and data.

This synchronizing block includes an input event temporary storage circuit 25, an activation timing judging circuit 27, an output event temporary storage circuit 28 and a final completion signal judging circuit 26. The input event temporary storage circuit 25 receives an input event generation signal group 33 from the higher-level block. The activation timing judging circuit 27 outputs activation signals 35 of 1–n lines to the lower-level blocks by judging an activation condition (transition condition). The output event temporary storage circuit 28 receives completion signals returned reversely from the lower-level block group in the form of output event generation signal group 36 and stores these signals. The final completion signal judging circuit 26 outputs final completion signals 34 of 1–m lines to the higher-level block.

Figure 8A:
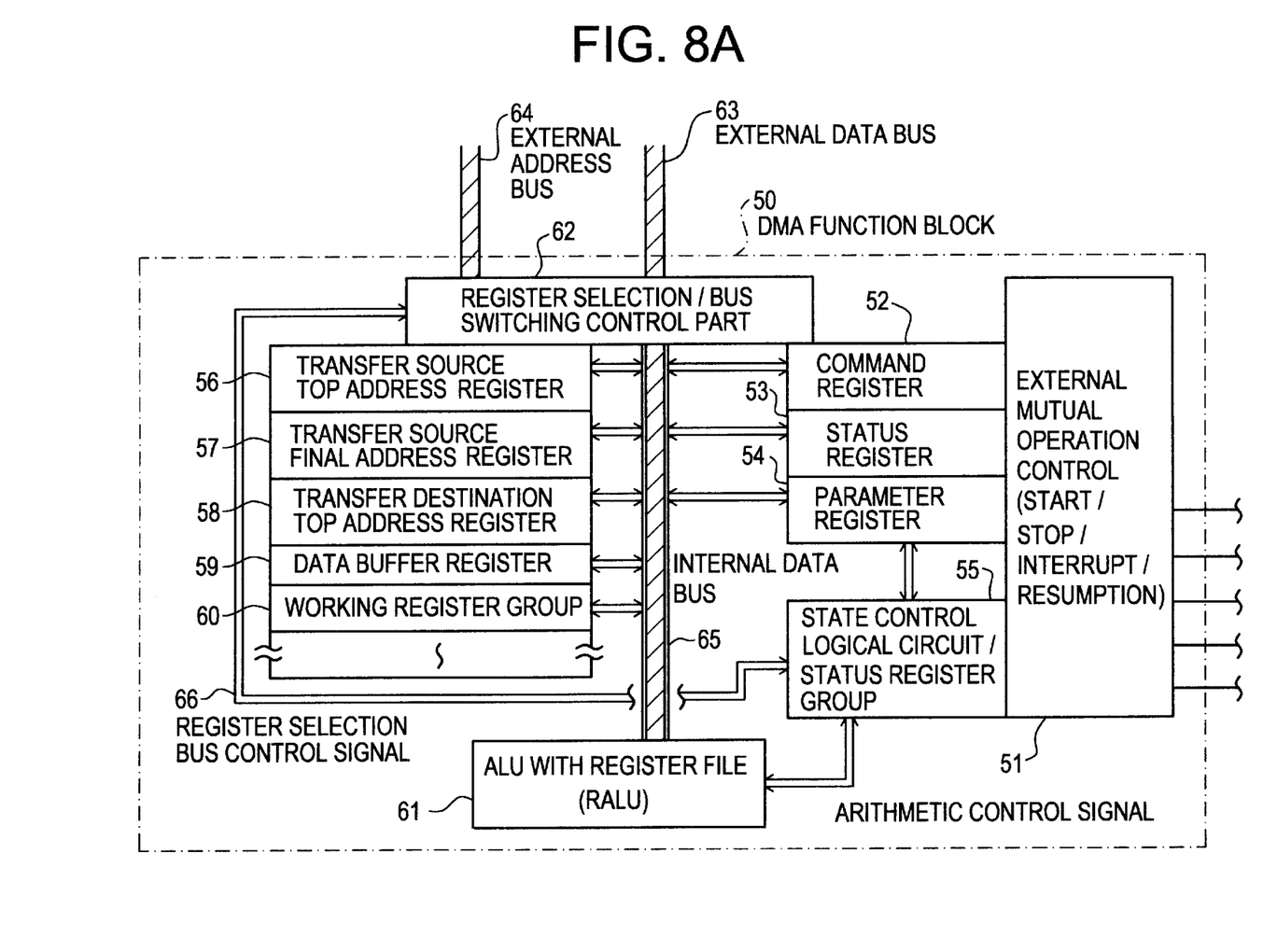
FIG. 8A–B are block diagrams illustrating a transmission module from a high level to a low level of the rendezvous unit.
Figure 8B:
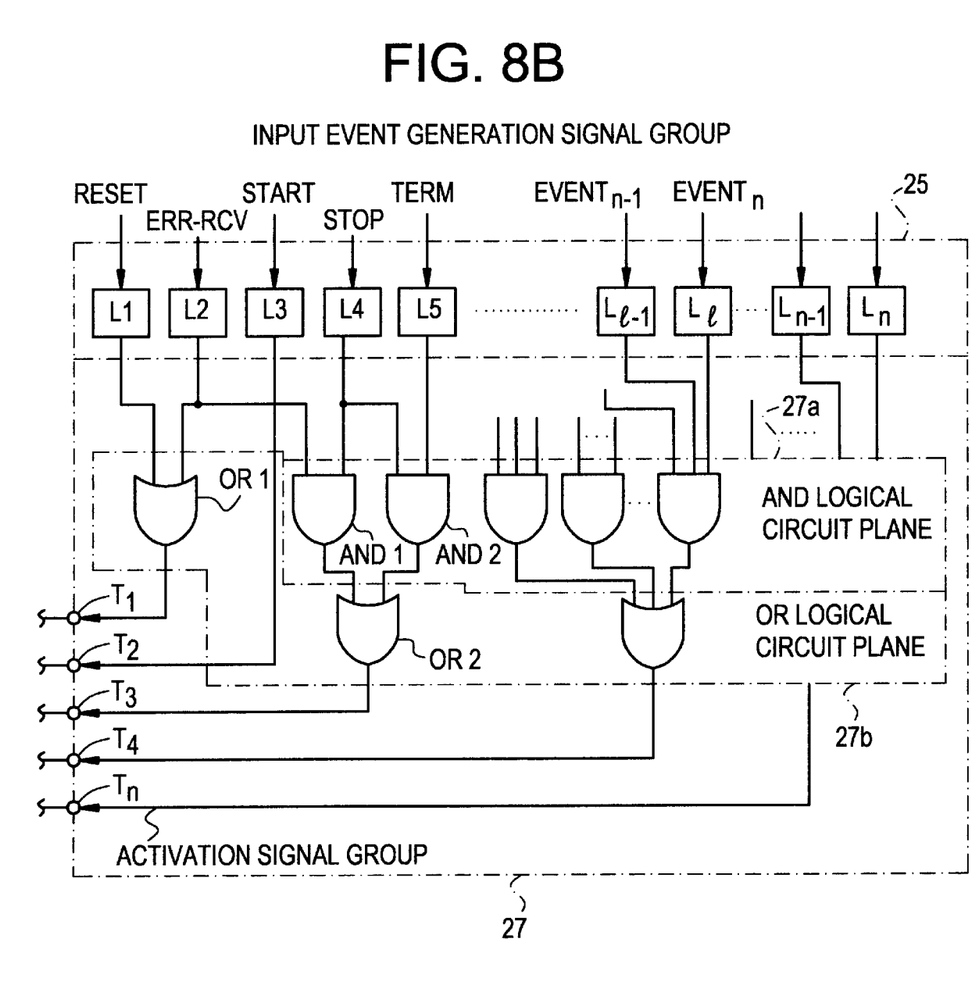

FIG. 8 illustrates a module for transmitting the signals from the higher-level block to the lower-level block. FIG. 8 shows, more specifically, the input event generation signal group 33, the input event temporary storage circuit 25, the activation timing judging circuit 27 and a DMA function block 50 as a lower-level function block.

Herein, the input event generation signal group includes signals representing reset (RESET), error receiving (ERR-RCV), start (START), stop (STOP), termination (TERM) and event (EVENT).

The input event temporary storage circuit 25 includes a plurality of latches $L_1$–$L_n$. The signal RESET is inputted to the latch $L_1$. The signal ERR-RCV is inputted and held in the latch $L_2$. The signal START is inputted and held in the latch $L_3$. The signal stop is inputted and held in the latch $L_4$. The signal TERM is inputted and held in the latch $L_5$. The signals EVENT are inputted and held in the remaining latches.

The activation signals appearing at terminal group $T_1$–$T_n$ are inputted to an external mutual operation control unit 51 of the DMA function block 50 conceived as a lower-level block. The control unit 51 controls a start, a stop, an interrupt and a resumption. Tho external mutual operation control unit 51 incorporates a command register 52, a status register 53, a parameter register 54, a state control logical circuit/state register group 55. These components are each connected to an internal data bus 65.

Arithmetic control signals obtained in the logical circuit 55 by use of the registers 52, 53, 54 are supplied to an ALU 61 with a register file. An arithmetic result thereof is outputted to the internal bus 65.

Connected also to this internal bus 65 are a transfer routing top address register 56, a transfer destination end address register 57, a transfer destination top address register 58, a data buffer register 59 and a working register group 60.

The internal data bus 65 is connected via a register selection/bus switching control unit 62 to an external data bus 63. An external address bus 64 is also connected thereto. The register selection/bus switching control unit 62 and the state control logical circuit/state register group 55 are connected to each other via a dedicated line 66.

This DMA function block performs a desired data transfer action on the basis of the signals outputted from the activation timing judging circuit 27.

Figure 9A:
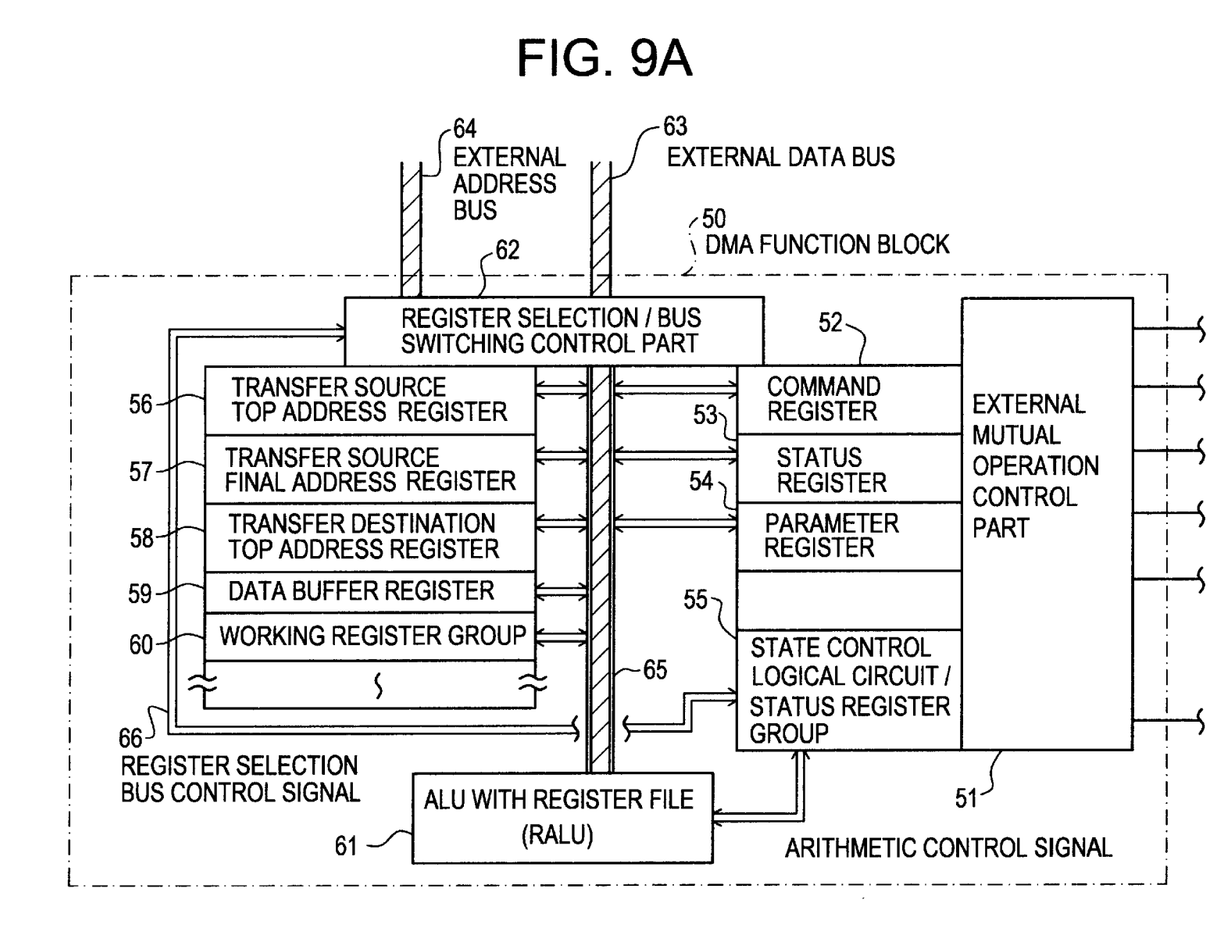
FIG. 9A–B are block diagrams illustrating the transmission module from the high level to the low level of the rendezvous unit.
Figure 9B:
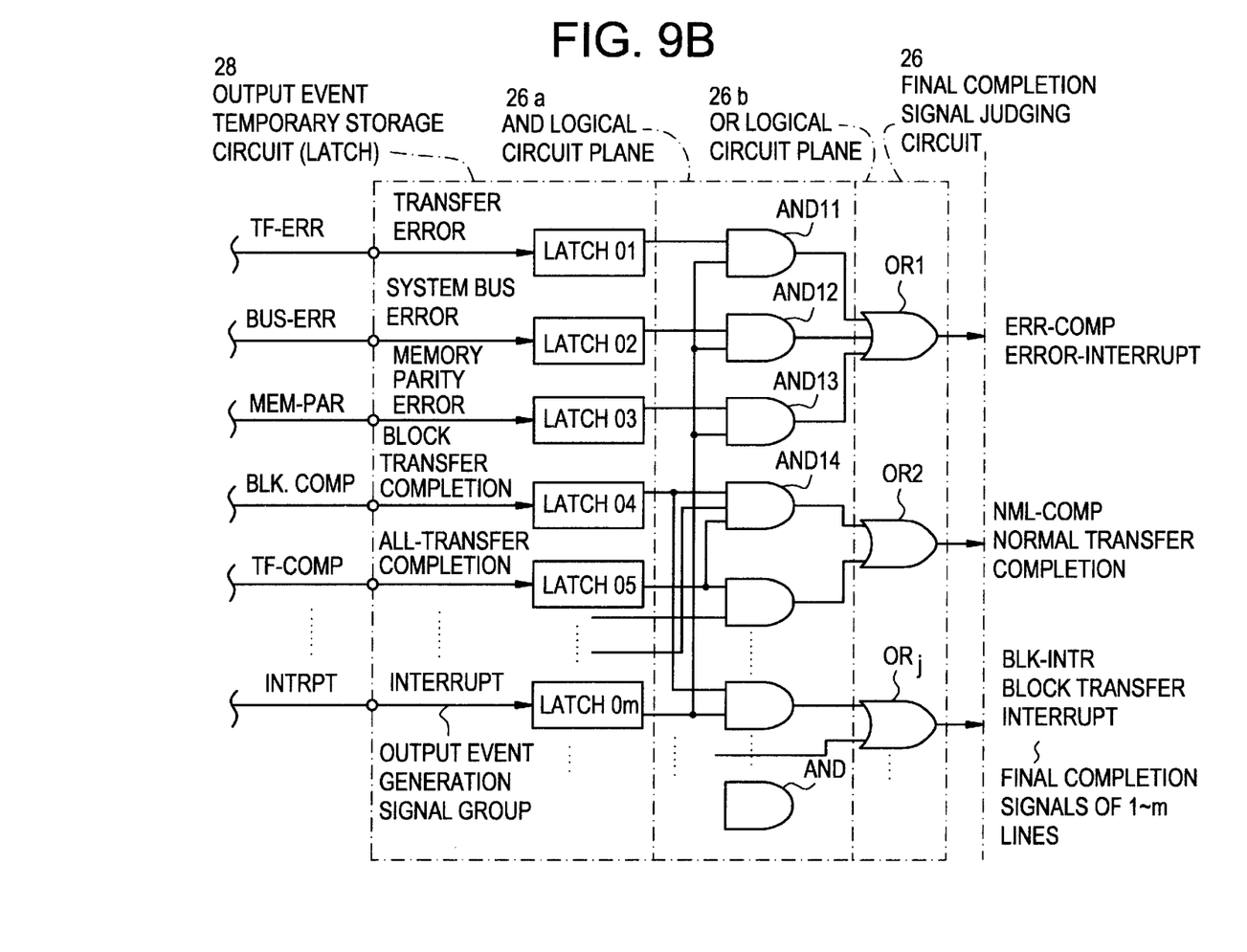

FIG. 9 illustrates a module for transmitting the signals from the lower-level blocks to the higher-level block shown in FIG. 6. FIG. 9 shows, more specifically, the lower-level DMA function block 50 to be controlled, the output event temporary storage circuit 28 and the final completion signal judging circuit 26.

The same external DMA function block 50 as the one shown in FIG. 8 outputs a transfer error signal TF-ERR, a system bus error signal BUS-ERR, a memory parity error signal MEL-PAR, a block transfer completion signal BLK-COMP, an all-transfer completion signal TF-COMP and an interrupt signal INTERPT. Then, these signals are inputted and held in a plurality of latches LO1–LOm provided in the output event temporary storage circuit 28.

With outputs of these latches, an AND logical circuit plane 26a and an OR logical circuit plane 26b of the final completion signal judging circuit 26 generate and output the final completion signals, e.g., an error interrupt signal is ERR-COMP, a normal transfer completion signal MNL-COMP, a block transfer interrupt signal BLK-INTR. For instance, the error interrupt signal ERR-COMP is obtained by such processing that outputs of the latches L01, L02, L03 and an output of the latch LOn are ANDed by AND gates 11, 12, 13, and outputs thereof are ORed by an OR gate OR11.

Figure 10:
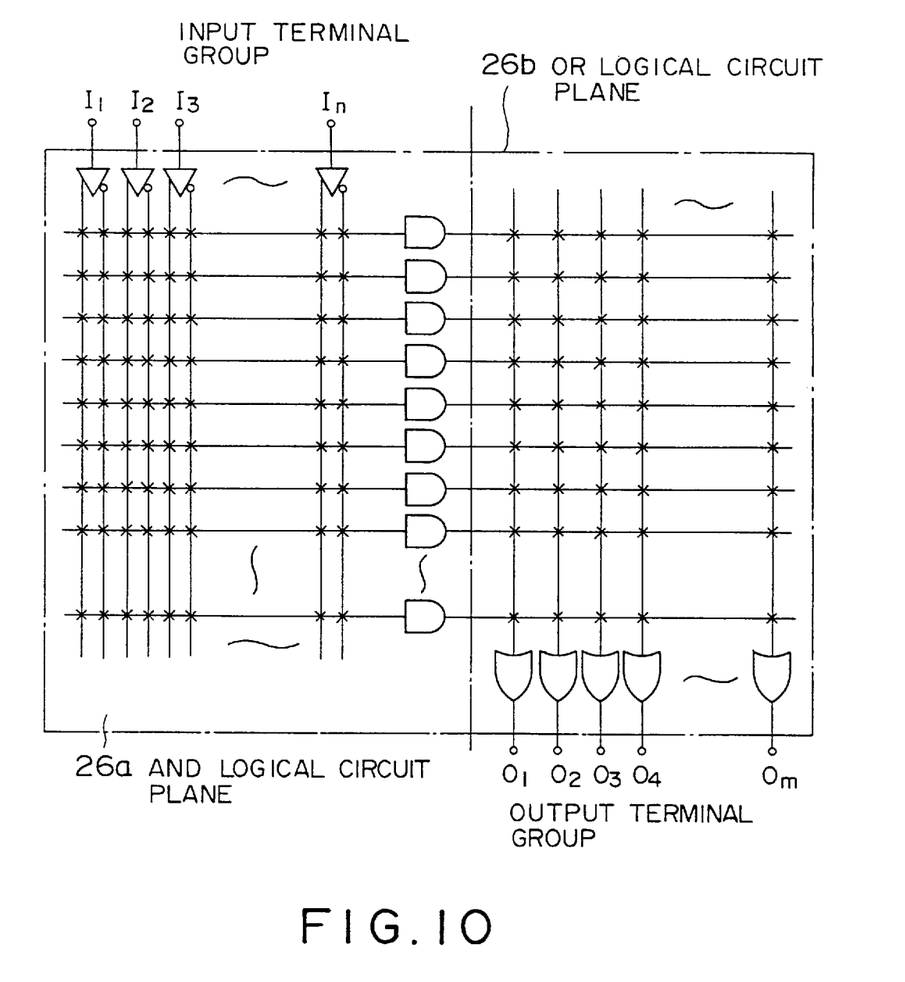
FIG. 10 is a circuit diagram illustrating detailed configurations of an AND logical circuit plane and an OR logical circuit plane in FIG. 9.

FIG. 10 is a circuit diagram fully showing configurations of the AND logical circuit plane 26a and the OR logical circuit plane 26b illustrated in FIG. 9. This circuit is configured as a programmable logic array (PLA). Connecting intersections marked with x in FIG. 10 and connected to input terminal groups I1–In are cut off with respect to a logic "0". Desired combinational logic of the AND gates and the OR gates is obtained from output terminal groups O1–Om. An AND logical circuit plane 27a and an OR logical circuit plane 27b shown in FIG. 8 also have the same configurations.

In accordance with this embodiment, the input event temporary storage circuit and the output event temporary storage circuit are constructed by the latch circuits. These circuits are not, however, limited to the latches but may, as a matter of course, involve the use of flip-flops such as a J-K type and an RS type and also temporary storage means in other forms.

Figure 11:
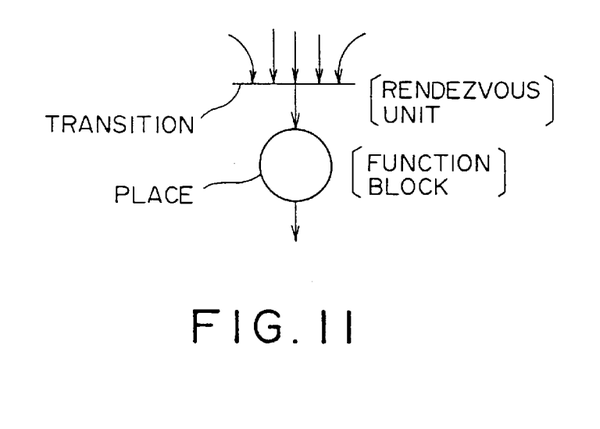
FIG. 11 is an explanatory diagram of a real time system modeling simulation notation method in Petri net.

The synchronizing block (rendezvous unit) discussed above is adapted to the Petri net theory known as a real time operation model description/verification method shown in FIG. 11. Namely, there is effected such queuing that the action proceeds to the next step after the conditions required have been prepared in conformity with this theory. As a result, the rendezvous unit judges a transition (activation condition) referred to as a firing condition in Petri net and generates the activation signal. The activation signal is supplied to the function block called a place, That is, this synchronizing black imparts only the activation signal to the lower-level function blocks but does not directly impart the clocks.

Further, this Petri net theory is also applied to a case where data or instructions are transferred from the lower-level function blocks to the higher-level function block. Namely, the higher-level block is informed of the completion after the completion conditions of jobs on the low level have been prepared.

Referring back to FIG. 7, the action of this synchronizing block will next be explained. To start with, the input event temporary storage circuit 25 stores the input event generation signal group 33 serving as a condition necessary for activating the lower-level blocks from the higher-level block. Subsequently, the activation timing judging circuit 27 judges the activation condition (transition condition), thereby generating the activation signals of 1–n lines. Reversely, the completion signals returned from the lower-level block group are stored as the output event generation signal group 36 into the output event temporary storage circuit 28. Queuing continues till the final completion state is present in the final completion signal judging circuit 26. Just when the condition becomes coincident, the final completion signals 34 of 1–m lines are outputted to the higher-level block.

Figure 12:
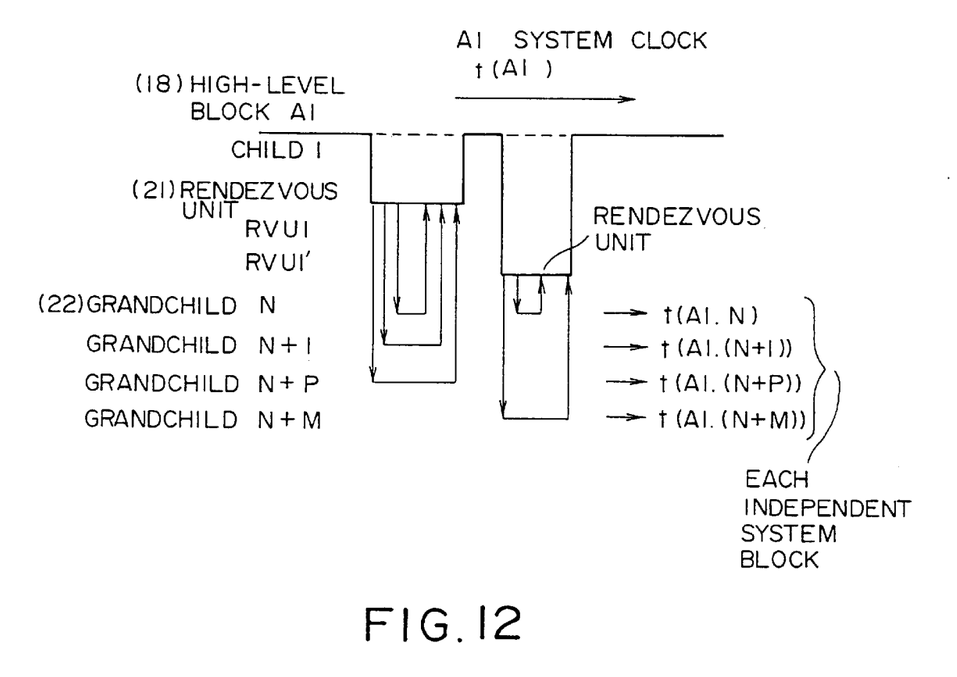
FIG. 12 is an explanatory diagram showing operations of an inter-hierarchy synchronizing system.

FIG. 12 is an explanatory diagram showing the action of the hierarchical structure synchronizing system in this embodiment. For example, it is assumed that the first child block 18 activates the Nth grandchild block 22, an unillustrated (N+1)th grandchild block, and an unillustrated (N+P)th grandchild block and the (N+M)th grandchild block 23. FIG. 6 illustrates a role of the first rendezvous unit 21 when queuing completions of the actions thereof. The grandchild blocks (N, N+1, N+P, N+M) are independent of each other in terms of their synchronizing systems. The grandchild blocks each have independent system clocks t(A1, N), t(A1, N+1), t(A1, N+P), t(A1, N+M). These grandchild blocks act absolutely irrespective of the clocks t(A1) of the first child block 18 marked with A1 and defined as a higher-level block through an unillustrated rendezvous unit marked with RVU1' as well as through the first rendezvous unit 21 with RVU1. Namely, the whole system is constructed as if the absolute time does not exist.

Figure 13:
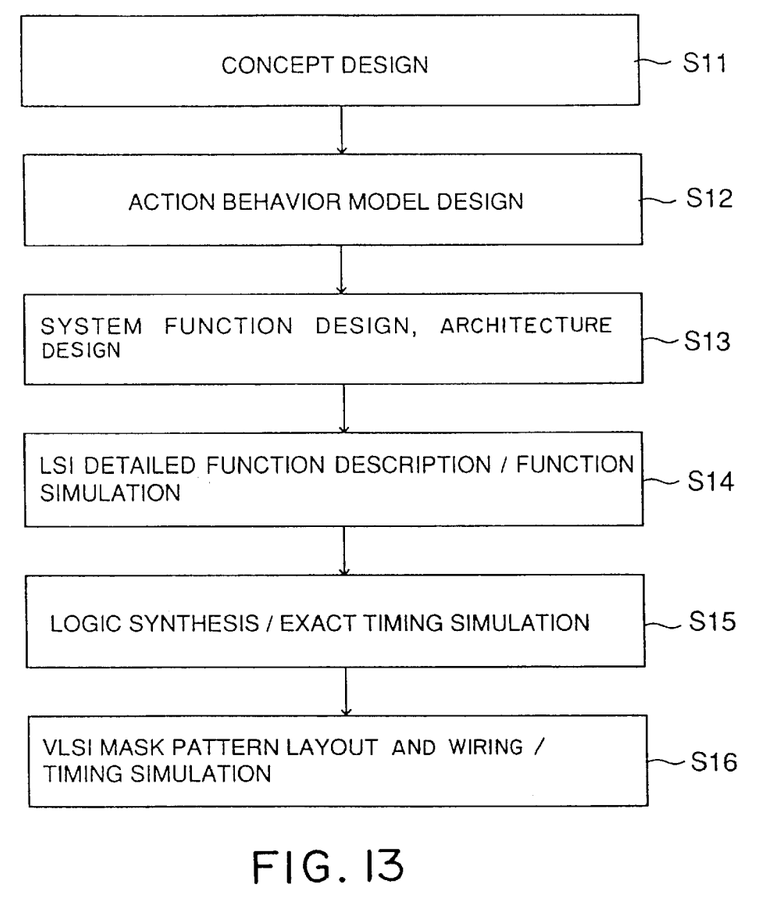
FIG. 13 is a flowchart showing procedures of designing the LSI according to the present invention.

FIG. 13 shows procedures of designing the LSI according to this invention. It is herein assumed that a VLSI (e.g., 500,000 or more elements, chip size is 10 mm×10 mm or larger with CMOS or BiCMOS process of a rule on the order of 0.6 μm or less) is to be designed.

At the first onset, a concept design is conducted (step S11). Determined in this step is a basic specification as a request characteristic of giving what function to the VLSI to be designed.

Hence, a determination is made as to what type is employed as an existing mega-cell. Designing is conducted to have, if no function block with a necessary function exists, a self-closed independent function and an independent timing (clock system) for a smooth execution thereof. In this case, each function block waits for a data group or input signals given thereto and a data group or output signals obtained resultantly. If activated, the same action is executed, i.e., a visible value is incremented.

Performed subsequently is an action/behavior model design of how the whole system acts when combining the mega cells described above (step S12).

This design involves the use of a design tool called an upper-stream CASE (Computer Assisted Software Engineering) tool such as, e.g., TEAMWORK by CARRE Corp.. This tool assists the system design by analyzing a user's request specification.

Next, a system function design and an architecture design are carried out (step 513). That is, functions and architectures in the respective blocks are examined in detail. Based on the results thereof, a description of an LSI detailed function and a function simulation are conducted (step S14). In these designs, for instance, VHDL (VHSIC (Very High Speed IC) Hardware Description Language) is available as an LSI system description language.

Subsequently, a logic synthesis and an exact timing simulation are effected (step S15), thereby determining the particulars of the circuit. Based on this, the elements are arranged, wiring is performed, and mask patterns are laid out (step S16). At this stage, a tool for an automatic logic synthesis is employed. The typical tool is Synopsis.

In steps S14, S15, the system is constructed to activate the function block outwardly of the exterior of this block, and an adjustment is made in the higher-level block utilizing this.

The higher-level function block effects setting so that an activation timing and a completion timing of the lower-level function block to be utilized are queued with the aid of the above-mentioned synchronizing block (rendezvous unit). It is herein presumed that the activation timing and the completion timing are created by the event generation signal group for actualizing tokens in the real time modeling simulation notation such as, e.g., Petri net.

The synchronizing block is constructed of: storage circuits for temporarily storing at least the input event generation signal group; a judging circuit for judging a timing for activation (generation) with a combination of these storage circuits; a storage circuit for temporarily holding the output signal group or the data group or the output event generation signal group for giving information of an independent completion timing; and a circuit for judging an expected final target completion signal with a combination of outputs of the storage circuits. Then, the synchronizing circuit is so constructed as to be capable of solely receiving the respective completion signals at different timings from a plurality of lower-level blocks and creating the final target completion signal through the judging circuit.

Further, a plurality of synchronizing circuits can be used with a hierarchical combination thereof. It is therefore possible to utilize the synchronizing blocks by sectioning queuing of the synchronous timing at several stages.

The available synchronous timings are those created with the parent being an original clock given from the exterior of the VLSI chip or created independently in the function blocks positioned on respective hierarchical levels or created indirectly by utilizing an original clock system.

Note that the most important timing among the synchronous timings is a completion timing or an activation timing as a result of judging the input or output event generation signal group produced inwardly of the synchronizing circuit.

The design of such timings will hereafter be described in greater detail.

Two design levels are provided. A level 1 is divided into the following nine determination steps.

Firstly, a driving process as a higher-level block involves:

(1) arriving times (t ariv) of a process, a signal and data from the exterior of the system, and (2) lifetimes ($\tau$ in-life) thereof.

Secondly, a driven process as a lower-level block involves:

(3) a receivable time ($\tau$ in-rv) and a receipt possible-of-start time (t in-rcv) of (1), (4) an in-system process generation time (t birth), (5) an in-system process lifetime ($\tau$ proc), (6) originating times (t xf) of process, signal and data from the interior of the system, (7) lifetimes ($\tau$ xf-lifx) of (6), and (8) an in-system process decay time (t death).

Finally, the receipt of the result of the driving process (higher-level block) involves:

(9) receivable periods ($\tau$ ex-rv) and receipt possible-of-start times ($\tau$ ex-rcv) of the in-system process, signal and data.

Figure 14:
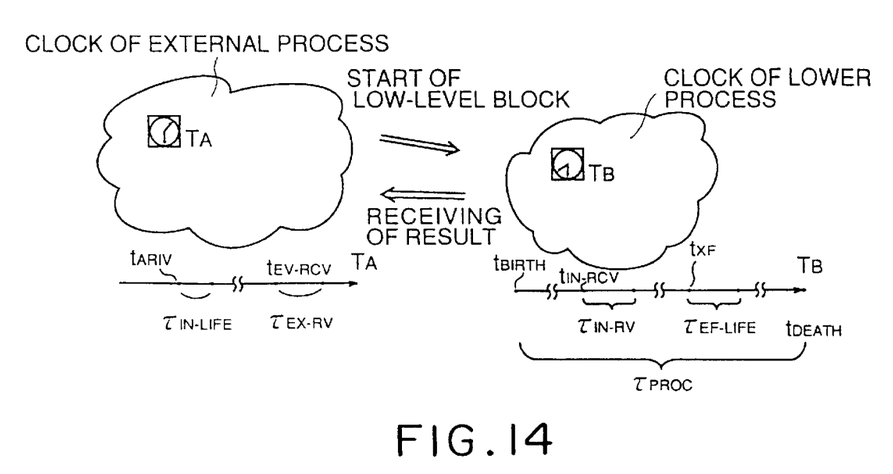
FIG. 14 is an explanatory diagram showing a timing versus time relationship between the higher-level block and the lower-level block.

FIG. 14 shows a relationship therebetween.

Let Ta be a clock of a calling side (external process side) in the rendezvous unit, and let Tb a clock on the called side (internal process side). No clock exists on the two sides. It is because generally a different process can be expressed independently by an absolutely separate clock.

An external specification of the rendezvous unit is designed and verified in accordance with the completed model in step S13 by use of abstract timing simulation of the level 1 in steps S11, S12.

A time variable t on the level 1 represents a timing, and $\tau$ indicates a time interval. When a strict discrimination is needed, however, the following expression may be taken.

Before-and-after relationship t1<t2

Simultaneous relationship t3//t4 $\tau$3//$\tau$4

Unrelatedness t5/=t6 $\tau$5/=$\tau$6

Time-in t7 in t8 $\tau$7 in $\tau$8

Time-out t9 out t10 $\tau$9 out $\tau$10

Note that this expression is given by way of one example, and, as a matter of course, other notation methods may be adoptable. For example, an expression such as t1 LT (Less Than) t2 can be adopted for expressing the before-and-after relationship.

Next, the explanation moves to the design level 2.

In this level, the driving-side clock and the designed evaluated mega cells are allocated to the abstract time variables (timing, time interval) so as to be adaptable to steps S14, S15, S16 described above.

In such design procedures, if the rendezvous unit is employed according to plan, the signals and data can be accurately transferred and received within the chip. Further, effects are exhibited if the timing and time interval variables such as before-and-after sequence, simultaneousness, unrelatedness, time-out and time-out are newly taken as important means into the system description language and the hardware description language. As a result, the VLSI can be designed and configured by using the languages accustomed to the designer.

Thus, the respective blocks constituting the VLSI are designed while strictly keeping the preparation conditions of the function blocks shown in FIG. 15. Further, the higher-level block employs the rendezvous unit as a synchronizing unit. As can be understood from FIG. 6, if the system designer thereby actualizes the request system within the chip, it is possible to foresee a linkage between the higher-level block and the timing. The system simulation based on the mathematical method is thereby facilitated.

This has such a very large implication that the system operation model can be sufficiently correctly verified on the system description language levels under the present circumstance wherein the VLSI can not be constructed any more by the logic design method that a logic diagram is manually depicted.

Hence, even when the maker acquires a desired VLSI by cooperating and sharing with the users, a desirable mode can be actualized, wherein the user himself or herself constructs the chip on the language level. To be specific, as stated earlier, when designing the hierarchy synchronizing means, an automatic logic synthesis with the simulation is carried out by use of the abstract timings at which the before-and-after relationship between the timings and the simultaneousness thereof is defined by the timing variable with the aid of the CAD tool in the upper-stream design process. The VLSI can be developed with safety in a short period of time by taking in the design method of effecting the real timing simulation thereafter.

The meaning of "independent" will be explained again hereinbelow. "Independent" means that a functional block of a hierarchical level cannot be directly influenced by other functional block of the same hierarchical level. In other words, it means that a functional block receives a result (output event) from other functional block of the same hierarchical level via a higher-level functional block without exception.

Accordingly, functional blacks of the same level already finish operations within the same time interval if activation conditions (input event) given by a higher-level functional block are the same. As a result, for a functional block, it is sufficient to always estimate the same time interval from the activation to completion of operations as far as the same input event is given thereto, and therefore facilitates design activities.

The VLSI attained in the manner discussed above is summarized by the following technical characteristics.

First, in any of the plurality of used-per-hierarchy function blocks fractionalized by the hierarchical structure design method, the function executed by the logical circuit (storage circuit group and combinational circuit group) within the block is single and independent.

Then, the function block assures the same timing till the individual action is completed since the activation has been conducted. Namely the function block is capable of foreseeing the same action each time. The higher-level block activates (starts) and operates the lower-level block group with a predetermined function according to the necessity by use of the synchronizing circuit block (rendezvous unit). Reversely, the completion signal group of the lower-level blocks is synchronized by this unit. The higher-level block receives the data or the control signals at a timing as a consequence of this.

The synchronizing circuit block is thus employed, whereby each function block is released completely from the timing dependent relationship with other blocks. The design can be independently performed in the system description language or the hardware description language. The sequence relationship according to the request specification of the system, i.e., the timing design, can be attained without being influenced by an error in delay of delivery of the absolute timing clock system to the overall area of the chip. Then, the problem in terms of timing in the hierarchical structure design depends only on the period for which the higher-level block activates the lower-level blocks and can be foreseen. The LSI can be therefore actualized exactly according to the design.

The following is an explanation of a method of making possible the CAD tool for expressing the VLSI chip by the steps of expressing the respective components in the system description language and the hardware description language subsequent thereto, effecting the function verification including the system timing and making the automatic logic synthesis tool more effective.

To begin with, when describing the action model (behavior model) in the system description language, the timing signals are defined as local timing variables in the function blocks fractionalized into hierarchies by the system analysis and design. The variables are not real number type (ps, ns, $\mu$s, ms . . . ) values but are expressible by a relative before-and-after sequence with another timing signal or the same timing or independence (don't care). It is of highest importance to access and utilize the synchronizing circuit as a synchronizing system in the form of function values or procedure values, i.e., perform a replacement with variable values.

When describing the detailed function model in the hardware description language, the timing signals are defined as local timing variables in the function blocks fractionalized as in the case of the system description language. Employed in this instance is a means of replacing I/O timings of standard cells on a register transfer level or already-designed/manufactured macro cells (including megacells MPU cores, etc.) with intrinsic functions in addition to the before-and-after sequence, the same timing, the independence and the synchronizing circuit function.

With respect to all the timing variables, estimation timings can be allocated and set from the higher-level module. The lower-level module is capable of informing the higher-level module of the defined timings. Values are set in the timing variable of the already-designed module by utilizing this, thereby verifying whether adaptable to the estimation values of the higher-level module or not.

The time interval variables also define whether wider or narrower than or identical with or partially overlapped with other variables or in the before-and-after relationship with each other on the external side or unrelated with each other as similar to the above-mentioned. The timing variables representing the timing and the time interval define the synchronizing circuit itself in the form of function type variables; or alternatively the interior of the synchronizing circuit is defined by use of these variables. Then, definitions are made with respect to the timing variables, signal designations when describing the VLSI and further the elements in the function block when the function block serves as a single unit, i.e., the lower-level block or the cell.

The circuit design and the function verification can be attained by the method described above in the system description language and the hardware description language as well. Asynchronous clocks independent with respect to each block are adopted for inter-circuit minor synchronization, inter-block intermediate synchronization and whole system major synchronization even in the system having one hundred million or more elements on the rule of 0.2 $\mu$m by taking clocks on the order of 100 MHz or larger. Even in such a case, the exact design can be conducted.

As discussed above, according to the inter-hierarchy synchronizing system of this invention, there are hierarchized the function blocks having the own timing systems expressed respectively by own time variables. The synchronizing blocks is interposed between the higher-level block and the lower-level block. It is thus feasible to ensure the action of each function block regardless of the whole timing. Further, the inter-hierarchy synchronizing means is obtained by the real timing simulation after the automatic logic synthesis as well as by the abstract timing simulation by employing the respective timing variable of the high- and lower-level blocks. The system construction can be thereby facilitated.

Besides, in the LSI wherein the inter-hierarchy synchronizing means described above is actualized together with the plurality of function block circuits on the chip, an adjustment of the clocks between the function blocks is not required. Accordingly, there is no necessity for adopting the clocks having unnaturally high frequencies. The secure and highly reliable circuit can be attained even in the high-speed LSI whose problem is a time-delay of clocks.

Moreover, the respective function blocks may be operated at the optimum clocks, and hence the function blocks exhibiting a high function are usable. A degree of freedom in design is also improved.

It is apparent that, in this invention, a wide range of different working modes can be formed based on the invention without deviating from the spirit and scope of the invention. This invention is not restricted by its specific working modes except being limited by the appended claims.

What is claimed is:

1. An inter-hierarchy synchronizing system comprising:

a higher-level functional hardware block for generating input event generation signals in accordance with a timing relation in a higher-level timing system in which timings are expressed by higher-level timing variables;

a lower-level functional hardware block, arranged in a hierarchical structure in combination with said higher-level functional hardware block, for performing predetermined operations in accordance with a local timing relation in a local timing system in which timings are expressed by a local timing variable that is not necessarily coincident with said higher-level timing variables on the basis of activation signals, wherein requirements of said system are functionally decomposed into said lower-level and higher-level functional hardware blocks; and an inter-hierarchy synchronizing means, provided between said higher-level functional hardware block and said lower-level functional hardware block, for outputting said activation signals for activating said lower-level functional hardware block by said local timing system on the basis of said input event generation signals generated by said higher-level functional hardware block, supplying said activation signals to said lower-level functional hardware block, generating a task completion signal at said higher-level timing system when an output event generation signal generated from said lower-level functional hardware block is set to indicate that all tasks are completed by said lower-level functional hardware block, and supplying said task completion signal to said higher-level functional hardware block, wherein said system is arranged in a hierarchical structure in which said higher-level functional hardware block controls a plurality of lower-level functional hardware blocks each having a local timing system, and said inter-hierarchy synchronizing means activates said plurality of lower-level functional hardware blocks in parallel.

2. The inter-hierarchy synchronizing system according to claim 1, wherein said inter-hierarchy synchronizing means includes a judging means for receiving task completion signals from said plurality of lower-level functional hardware blocks and generating said task completion signal when task completion signals from all of lower-level functional hardware blocks have been received.

3. The inter-hierarchy synchronizing system according to claim 2, wherein said inter-hierarchy synchronizing means assigns and sets estimation of timings which are determined according to a system requirement specification by said higher-level functional hardware block when the timings of signals defined in said lower-level functional hardware blocks and in said higher-level functional hardware block are used, and said lower-level functional hardware blocks report to said higher-level functional hardware block time interval variables expressed as a relationship between the estimation of timings and the timings defined in said lower-level functional hardware blocks and in said higher-level functional hardware block.

4. The inter-hierarchy synchronizing system according to claim 3, wherein a time interval variable is expressed as any one of a before-and-after relationship, a simultaneous relationship, a time in-and-out relationship and an unrelated relationship.

5. The inter-hierarchy synchronizing system according to claim 1, wherein at least any one of said higher-level functional hardware blocks and said lower-level functional hardware block has already been designed and library-registered.

6. The inter-hierarchy synchronizing system according to claim 1, wherein functions of said inter-hierarchy synchronizing means are realized by a timing simulation which is a simulation of timings with mutual relations and real timing simulation after an automatic logic synthesis by use of respective timing variables of said lower-level functional hardware block and said higher-level functional hardware block.

* * * * *